United States Patent [19]

Narciso

[11] Patent Number: 4,831,377
[45] Date of Patent: May 16, 1989

[54] METHOD AND APPARATUS FOR REDUCED SETTLING TIME IN A FILTER FOR A DC VOLTAGE

[75] Inventor: Steven J. Narciso, Longmont, Colo.

[73] Assignee: Hewlett-Packard Company, Palo Alto, Calif.

[21] Appl. No.: 44,870

[22] Filed: Apr. 30, 1987

[51] Int. Cl.⁴ .............................................. H03M 1/68
[52] U.S. Cl. .................................... 341/118; 341/150; 323/351
[58] Field of Search ................ 323/351; 340/347 DA, 340/347 M, 347 CC; 363/44, 45; 341/118, 144, 150, 155, 172

[56] References Cited

U.S. PATENT DOCUMENTS

| | | | |
|---|---|---|---|
| 4,229,703 | 10/1980 | Bustin | 340/347 CC X |
| 4,556,867 | 12/1985 | George | 340/347 M X |
| 4,661,802 | 4/1987 | Yukawa | 307/243 X |

OTHER PUBLICATIONS

The Engineering Staff of Analog Devices, Inc., Analog-Digital Conversion Handbook, 6/1972, pp. I-59; II-32 to II-35.

*Primary Examiner*—William M. Shoop Jr.
*Assistant Examiner*—Brian K. Young
*Attorney, Agent, or Firm*—Edward L. Miller

[57] ABSTRACT

The dielectric absorbtion of capacitors in a filter that removes the AC component from a precision digital-to-analog converter (DAC) is effectively eliminated by operating the normally grounded end of the filter at a DC voltage that approximates the DC output voltage from the precision DAC. This prevents the capacitors in the filter from becoming charged to a DC voltage, and has the further benefit of reducing the number of time constants otherwise spent in charging and discharging those capacitors to within some specified percentage of the output DC voltage. The result is greatly reduced settling time for the filter. The filter may be of any convenient type. The precision DAC may be of the type that switches between ground and a precision reference voltage with a precisely controlled duty cycle, and the approximating voltage may be obtained from any conventional DAC.

16 Claims, 1 Drawing Sheet

METHOD AND APPARATUS FOR REDUCED SETTLING TIME IN A FILTER FOR A DC VOLTAGE

BACKGROUND AND SUMMARY OF THE INVENTION

Low pass filters are often used to recover the DC component of a signal having both AC and DC components. The present invention relates generally to improvements in the filtering methods and apparatus applicable to such recovery. In one preferred embodiment the invention is of particular utility in applications where the value of the DC voltage to be recovered can change either abruptly or slowly over a period of time, and where the change can be estimated as it occurs. In one particular application of the invention an abruptly changing DC voltage to be produced is available with reduced filter settling time. This result obtains even in cases where the filter is of the multi-pole variety that would normally have settling times of many time constants. With the aid of the invention one actual size pole 200 Hz low pass filter settles to within one part per million (ppm) in only 40 milliseconds. Without the aid of the invention the same filter requires three seconds for the same degree of settling.

Consider the following example of an actual application of the invention. One type of high resolution digital-to-analog converter (DAC) employs a two-pole switching mechanism connected between an accurate reference voltage and ground. The switch is toggled at a regular rate, producing a waveform having both AC and DC components. The ratio of the times of connection between the reference voltage and ground accurately determines the DC component. The output of the switch is applied to a filter to remove the unwanted AC component.

In such a DAC stringent demands are placed upon the filter if the DAC is to be of high accuracy and also have a low settling time. In particular, the phenomenon of dielectric absorbtion in the capacitors of the filter can disturb the filter's output for a relatively long period of time subsequent to a change in output voltage from the DAC. In accordance with the invention described below such disturbance (and its associated increase in settling time) can be avoided by reducing to a minimum the DC voltage across the capacitors in the filter. This may be done by operating the filter between the DAC output and a voltage that approximates the DAC output, instead of between the DAC output and ground. The approximating voltage may be obtained from a less accurate high-speed second DAC.

DESCRIPTION OF A PREFERRED EMBODIMENT

Figure 1:
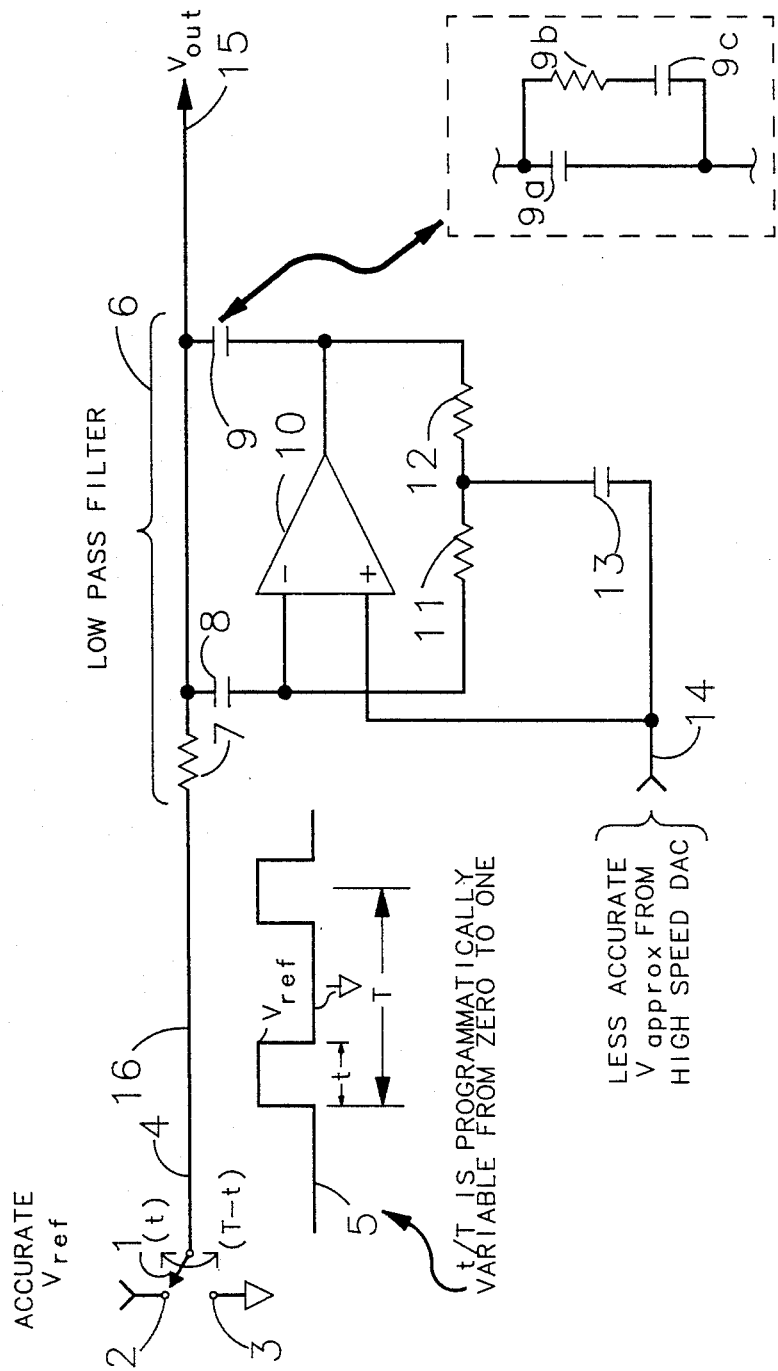
FIG. 1 is a simplified schematic diagram of a precision DAC whose output voltage is filtered in accordance with the invention.

Referring now to the figure, observe that a single pole double throw switching means 1 is connected to toggle between an accurate reference voltage $V_{ref}$ 2 and ground 3. As shown by the waveform segment 5, the output 4 of the switch 1 is regular and periodic rectangular waveform of period T. The circuit of FIG. 1 will produce a DC voltage $V_{out}$ 15 that is some fraction of $V_{ref}$. In accordance with the desired DC output voltage 15 a control mechanism (not shown) determines the length of time t<T that the switch 1 is to connect the output 4 to $V_{ref}$ 2. During the remaining portion T-t the output 4 is connected to ground 3. For example, if $V_{ref}$ were ten volts and a $V_{out}$ of seven volts were desired, then the ratio of t to T would be seven to ten. And if T were five hundred microseconds, then t would be 350 us.

The output 4 of switch 1 is applied to one input 16 of a low pass filter 6. The filter 6 may be considered to be a three-terminal network: an input terminal 16, an output terminal 15, and another terminal 14 that in a conventional filtering arrangement is connected to ground. It will be understood in light of the purpose of the filter 6 that in the present instance terminal 14 need be connected only to an AC ground to function as an effective filter for the output 4 of switch 1 and the associated waveform 5. That is to say, terminal 14 of filter 6 could be connected to any desirable DC potential as long as it was one of sufficiently low AC impedance.

In the drawing low pass filter 6 is shown as being an active filter. In principle, any suitable filter may be employed, even a simple RC network having a single pole. In practice, several considerations suggest the desirability of using an active: reduced settling time; increased attenuation of the AC component; and a lesser need for a low AC impedance to ground from terminal 14, since the "active" part of the filter has its own AC ground.

Since the particular active filter shown as low pass filter 6 is merely representative of one of any of a number of filters, active or not, that may by used as the filter 6, and since the operation of that particular filter configuration is known in itself through reference works on active filter design, it is unnecessary to dwell on the internal operation of that filter. For present purposes it is sufficient to note that it is comprised of resistors 7, 11, and 12, capacitors 8, 9, and 13, and of amplifier 10. It is in the capacitors that the mischief lies, and it becomes apparent when the filter 6 is operated with terminal 14 at DC ground. For it is then that the capacitors assume a charge to some DC voltage, and exhibit the phenomenon of dielectric absorbtion.

The phenomenon of dielectric absorbtion is often modelled as a series RC network in parallel with the main capacitance of the capacitor under consideration; see the inset of the Figure. According to this model, dielectric absorbtion for a capacitor such as 9 (represented in the inset by capacitor 9a) occurs as if there were a very large resistor 9b (whose value is typically $10^9$ ohms or more) in series with a capacitor 9c (whose value is typically a small percentage of capacitor 9a). When capacitor 9a is charged to a DC voltage for a sufficient length of time capacitor 9c becomes charged also. When capacitor 9a is charged to a different voltage, then capacitor 9c redistributes charge by charging capacitor 9a. This effect can be quite pronounced when the capacitor 9 is located in a high impedance circuit. In the application at hand (i.e., capacitance in a filter) the phenomenon of dielectric absorbtion manifests itself as an increase in settling time of the filter. This is most undesirable in a filter that receives the output of a high accuracy DAC, as it means the imposition of a longer than otherwise needed delay before a new voltage from the DAC can be used.

One solution to the problem of dielectric absorbtion is to use capacitors that exhibit very little of it. However, such parts are expensive, probably require testing to verify their properties, and still posses some minimum amount of dielectric absorbtion, anyway. A better solution is to fix the circuit of the filter so that little or no dielectric absorbtion occurs in the first place, regardless of the part used. This may be done by ensuring that there is never a DC component (or at least only a very small one) across the capacitors in the filter.

To this end terminal 14 of filter 6 is not connected to ground, but to a voltage $V_{approx}$ that always approximates the output voltage $V_{out}$. $V_{approx}$ is obtained from a second DAC (not shown) that is conventional. The mechanism that programs or controls the accurate DAC switch 1 and filter 6 also programs or controls the second DAC providing $V_{approx}$. In another application it may be desirable to use some other means to produce $V_{approx}$; e.g., a unity gain amplifier whose input is derived from the input voltage being applied to the input terminal 16 of the filter 6.

$V_{approx}$ need not be of high accuracy or even of particularly high stability. First, the voltage that "capacitor" 9c (and by extension, any of the other capacitors in the filter) charges to is only the difference (error) between the output of the second DAC ($V_{approx}$) and $V_{out}$. That difference is easily made a small percentage of $V_{out}$. Thus the charge on "capacitor" 9c available to disturb the new charge on main capacitance 9a is a mere fraction of what it would be if the full DC of $V_{out}$ were present. The effect is the same as if the actual amount of dielectric absorbtion in the capacitor were reduced by the ratio of $V_{out}$ to the error voltage between the two DAC's. Next, the stability of the voltage applied to terminal 14 of filter 6 by the second DAC does not affect $V_{out}$ as long as the filter does not pass any such dv/dt.

The prevention of dielectric absorbtion is one reason why the filter 6 exhibits reduced settling time. Another reason also follows from the essential absence of DC voltage across the capacitors in the filter: when there is a change in the DC voltage on input terminal 16 to be recovered, the various capacitors in the filter 6 do not need to charge or discharge to the entirety of that value. The capacitors will only need to recharge to the value of the difference ($V_{error}$) between the voltages on terminals 16 and 14. Since that difference can easily be made very small with respect to $V_{out}$, settling to one ppm of $V_{out}$ may require settling to only one percent or one tenth of one pecent of $V_{error}$. Thus a fewer number of time constants are required to reach the desired degree of settling.

I claim:

1. A method of reducing dielectric absorbtion in the capacitors of a filter having input, output and AC ground terminals, the method comprising the steps of:
   applying a signal having a DC component to the input terminal of the filter;
   approximating the DC component with a voltage source; and
   applying the voltage approximating the DC component to the AC ground terminal of the filter.

2. A filtered source of DC voltage comprising:
   means for producing a work voltage having a DC component;
   voltage approximation means for producing a voltage $V_{approx}$ that approximates the DC voltage to be provided by the filtered source; and
   filter means having an input terminal connected to the means for producing the work voltage, an AC ground terminal connected to $V_{approx}$, and an output terminal, the filter means for producing at the output terminal a filtered DC voltage equal to the DC component of the work voltage.

3. A filtered source of DC voltage as in claim 2 wherein the means for producing the work voltage comprises a DAC.

4. A filtered source of DC voltage as in claim 2 wherein the voltage approximation means comprises a DAC.

5. A filtered source of DC voltage as in claim 2 wherein the means for producing the work voltage and the voltage approximation means each comprises a DAC, and further comprising voltage control means coupled to each DAC for controlling the voltage generated by each DAC.

6. A digital-to-analog converter comprising:
   switching means for producing a waveform having both DC and AC components;
   voltage approximation means for producing a voltage $V_{approx}$ that approximates the DC component in the waveform produced by the switching means; and
   filter means having an input terminal connected to the waveform produced by the switching means, an AC ground terminal connected to $V_{approx}$, and an output terminal, the filter means for producing at the output terminal the DC component present at the input terminal.

7. A digital-to-analog converter as in claim 6 wherein the voltage approximation means comprises a DAC.

8. A filtered source of DC voltage as in claim 2 wherein the voltage approximation means comprises a unity gain amplification means having an input coupled to themeans for producing a work voltage.

9. A method of reducing dielectric absorbtion in the capacitors of an active filter having a voltage input, a voltage output and an AC ground reference input, the method comprising the steps of:
   applying a signal having a DC component to the voltage input of the active filter;
   approximating the DC component with a voltage source; and
   applying the voltage approximating the DC component to the AC ground reference input of the active filter.

10. A filtered source of DC voltage comprising:
    means for producing a work voltage having a DC component;
    voltage approximation means for producing a voltage $V_{approx}$ that approximates the DC voltage to be provided by the filtered source; and
    an active filter means having an input terminal connected to the means for producing the work voltage, an AC ground reference input terminal connected to $V_{approx}$, and an output terminal, the active filter means for producing at the output terminal a filtered DC voltage equal to the DC component of the work voltage.

11. A filtered source of DC voltage as in claim 10 wherein the means for producing the work voltage comprises a DAC.

12. A filtered source of DC voltage as in claim 10 wherein the voltage approximation means comprises a DAC.

13. A filtered source of DC voltage as in claim 10 wherein the means for producing the work voltage and the voltage approximation means each comprises a DAC, and further comprising voltage control means coupled to each DAC for controlling the voltage generated by each DAC.

14. A filtered source of DC voltage as in claim 10 wherein the voltage approximation means comprises a unity gain amplification means having an input coupled to the means for producing the work voltage.

15. A digital-to-analog converter comprising:

switching means for producing a waveform having both DC and AC components;

voltage approximation means for producing a voltage $V_{approx}$ that approximates the DC component in the waveform produced by the switching means; and an active filter means having an input terminal connected to the waveform produced by the switching means, an AC ground reference input terminal connected to $V_{approx}$, and an output terminal, the active filter means for producing at the output terminal the DC component present at the input terminal.

16. A digital-to-analog converter as in claim 15 wherein the voltage approximation means comprises a DAC.

* * * * *